United States Patent [19]
Spratt et al.

[11] Patent Number: 5,434,432
[45] Date of Patent: Jul. 18, 1995

[54] ANTIFUSE DEVICE FOR CONTROLLING CURRENT IN A CIRCUIT USING AN ANTIFUSE

[75] Inventors: David B. Spratt; Kueing-Long Chen, both of Plano, Tex.

[73] Assignee: Texas Instruments Incorporated, Dallas, Tex.

[21] Appl. No.: 161,718

[22] Filed: Dec. 3, 1993

Related U.S. Application Data

[62] Division of Ser. No. 951,481, Sep. 25, 1992, Pat. No. 5,284,788.

[51] Int. Cl.$^6$ ............... H01L 23/525; H01L 29/12
[52] U.S. Cl. .................... 257/50; 257/77; 257/530
[58] Field of Search .......... 257/50, 530, 52, 56, 257/55, 63, 77, 665

[56] References Cited

U.S. PATENT DOCUMENTS

| | | | |
|---|---|---|---|
| 4,499,557 | 2/1985 | Holmberg et al. | 257/480 |
| 4,748,490 | 5/1988 | Hollingsworth | 257/764 |
| 5,093,711 | 3/1992 | Hirakawa | 257/763 |

*Primary Examiner*—William Mintel
*Assistant Examiner*—Peter Toby Brown
*Attorney, Agent, or Firm*—Christopher L. Maginniss; W. James Brady, III; Richard L. Donaldson

[57] ABSTRACT

A device (10) for controlling current through a circuit has an antifuse material (18) separating a first conductor (12) and a second conductor (20). An insulating element (14) and another insulating element (16) further separate the first conductor (12) from the second conductor (20). The antifuse material (18) includes a dopant which raises the band gap and seals off paths in grain boundaries of the antifuse material (18) in order to limit leakage current from flowing between the first conductor (12) and the second conductor (20). When an interconnection is desired, a high voltage pulse is applied across the first conductor (12) and the second conductor (20) to initially break down the antifuse material (18). The breakdown of the antifuse material (18) causes a filament (22) to form between the first conductor (12) and the second conductor (20). The filament (22) creates a conduction path connecting the first conductor (12) and the second conductor (20) electrically together. Additional current is forced through the antifuse material (18) to permanently set the filament (22) in order to interconnect circuit elements coupled to the first conductor (12) and the second conductor (20).

7 Claims, 1 Drawing Sheet

ANTIFUSE DEVICE FOR CONTROLLING CURRENT IN A CIRCUIT USING AN ANTIFUSE

This is a division of application Ser. No. 07/951,481, filed Sep. 25, 1992, now U.S. Pat. No. 5,284,788.

TECHNICAL FIELD OF THE INVENTION

This invention relates in general to microelectronic devices and more particularly to a method and device for controlling current in a circuit.

BACKGROUND OF THE INVENTION

Electronically programmable circuits require a mechanism to prevent current from flowing through circuit paths not selected by a circuit designer for a desired circuit configuration. Such a mechanism is an antifuse material separating two conductors to prevent current from flowing between the two conductors. However, conventional antifuse materials allow significant leakage current to flow between the two conductors despite a desire to avoid current from flowing between the two conductors. This leakage current affects the functionality of the circuit, precluding proper circuit operation.

From the foregoing, it may be appreciated that a need has arisen for a method and device for controlling current in a circuit that limits leakage current from flowing between two conductors. A need has also arisen to modify the leakage characteristics of an antifuse material by increasing the effective band gap and seal off paths in grain boundaries of the antifuse material. Further, a need has arisen for an antifuse material with low leakage current in order to integrate a larger number of circuit paths without affecting the functionality of the circuit.

SUMMARY OF THE INVENTION

In accordance with the present invention, a method and device for controlling current in a circuit are provided which substantially eliminate or reduce disadvantages and problems associated with electronically programmable circuitry.

The device includes an antifuse material separating two conductors. The antifuse material contains a dopant which increases the band gap of the antifuse material to reduce unwanted current from flowing between the two conductors. The antifuse material prevents a conduction path from forming between the two conductors. When such a conduction path is desired, a high voltage pulse is applied at the two conductors to initially break down the antifuse material, forming a filament between the two conductors. Current starts flowing between the two conductors and the two conductors start fusing electrically together. Additional current is forced through the antifuse material to permanently set the filament, creating a conduction path connecting the two conductors electrically together.

The present invention provides various technical advantages over electronically programmable circuitry within the prior art. For example, one technical advantage is in reducing the leakage current flowing within the antifuse material. Another technical advantage is in raising the band gap and sealing off paths in grain boundaries of the antifuse material by introducing an appropriate dopant into the antifuse material. Still another technical advantage is in the ability to integrate a larger number of conductor pairs without the possibility of high leakage current affecting the functionality of the circuit. Other technical advantages are readily apparent to one skilled in the art from the following figures, descriptions, and claims.

BRIEF DESCRIPTION OF THE DRAWINGS

For a more complete understanding of the present invention and the advantages thereof, reference is now made to the following description taken in conjunction with the accompanying drawings, wherein like reference numerals represent like parts, in which.

DETAILED DESCRIPTION OF THE INVENTION

Figure 1:
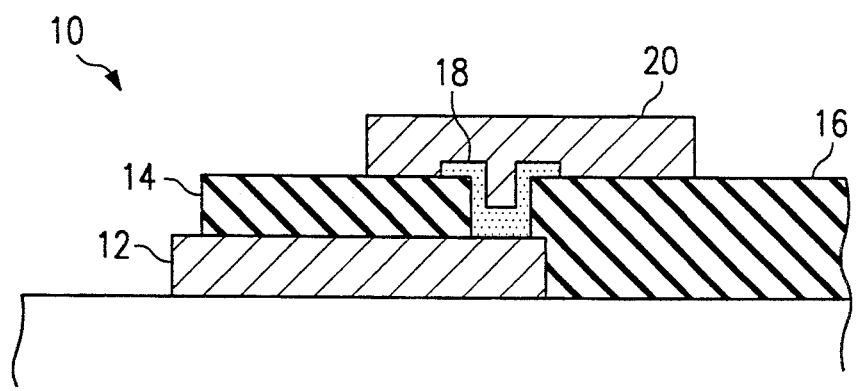
FIG. 1 is a highly magnified schematic sectional view of conductors separated by an antifuse material.

FIG. 1 is a highly magnified schematic sectional view of a circuit portion 10 of the present invention. Circuit portion 10 includes a conduction element 12 beneath insulating material 14 and insulating material 16. An antifuse material 18 separates conduction element 12 from a conduction element 20. Antifuse material 18 prevents current from flowing between conduction element 12 and conduction element 20. Typically, conduction element 12 and conduction element 20 couple to circuit elements comprising a circuit not shown in circuit portion 10 and antifuse material 18 prevents the circuit elements from interconnecting.

Antifuse material 18 can be deposited onto conduction element 12 through a plasma chemical vapor deposition system. Preferably, antifuse material 18 is formed by depositing hydrogenated microcrystalline silicon ($\mu$C-Si:H) onto conductor 12. A dopant is added to the reaction gas mixture of the hydrogenated microcrystalline silicon deposition to form $\mu$C-SiC:H, increasing the band gap of antifuse material 18 and sealing off paths in the grain boundaries within antifuse material 18. By raising the band gap and sealing off grain boundary paths in antifuse material 18, the dopant reduces leakage current which may flow between conduction element 12 and conduction element 20 to a low value. With low leakage current, a larger number of circuit portions 10 may be integrated without affecting the functionality of the overall circuit as may occur without the introduction of a dopant into antifuse material 18. Preferably, $CH_4$ is added to the gas mixture for hydrogenated microcrystalline silicon to increase the band gap of the resulting antifuse material 18, thus reducing leakage current.

Another method of forming antifuse material 18 is to implant a dopant into antifuse material 18 and anneal it to form the resulting dopant material. Preferably, hydrogenated microcrystalline silicon is doped with carbon to form a hydrogenated microcrystalline silicon carbon doped material to improve the leakage characteristics of antifuse material 18. Though carbon is described as the preferable dopant for antifuse material 18, other dopants such as fluorine can also increase the band gap and reduce the dangling bonds within antifuse material 18.

Figure 2:
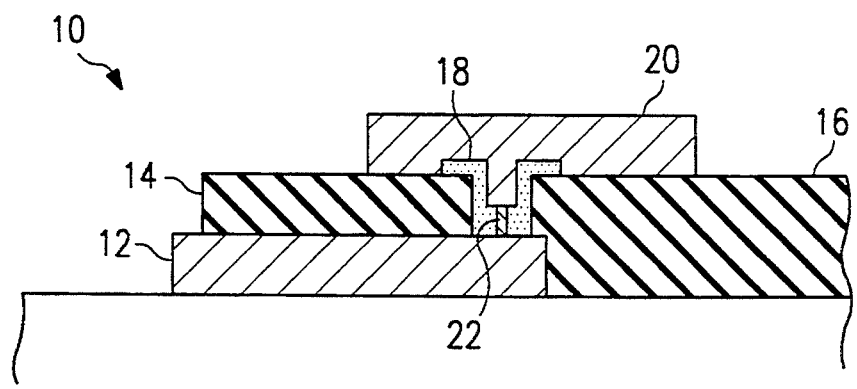
FIG. 2 is a highly magnified schematic sectional view of the antifuse material broken down to form a conduction path between the two conductors.

FIG. 2 is a highly magnified schematic sectional view of circuit portion 10 that has been electronically programmed. A circuit designer, desiring to create a conduction path connecting conduction element 12 and conduction element 20 electrically together, may apply a high voltage pulse across conduction element 12 and conduction element 20, creating enough stress to initially break down antifuse material 18 and starting the conductor fusing process. For circuits having a typical supply voltage of 5 volts, a voltage pulse of 15 to 20 volts can create enough stress to break down antifuse material 18. When this occurs, a filament 22 forms between conduction element 12 and conduction element 20 within antifuse material 18 creating a conduction path connecting conduction element 12 and conduction element 20 electrically together. Additional current is forced through filament 22, causing resistance of antifuse material 18 to go to its lowest value and permanently setting a conduction path between conduction element 12 and conduction element 20. In this manner, circuit elements coupled to conduction element 12 and conduction element 20 are now connected together forming the desired circuit path.

In summary, an antifuse material having improved leakage characteristics is used to control current flowing through a circuit. The antifuse material contains a dopant which widens the band gap and reduces dangling bonds within the antifuse material. As desired, the antifuse material can be broken down by a high voltage pulse to create a conduction path connecting two conductors separated by the antifuse material electrically together.

Thus, it is apparent that there has been provided, in accordance with the present invention, a method and apparatus for controlling current through a circuit that satisfies the advantages set forth above. Although the preferred embodiment has been described in detail, it should be understood that various changes, substitutions, and alterations can be made herein. For example, though the preferred embodiment uses hydrogenated microcrystalline silicon, non-hydrogenated silicon and amorphous silicon may also be used. Further, the desired antifuse material may be deposited by other methods such as by sputtering in a physical vapor deposition process. Also, other dopants may be used other than those described to increase the bandgap of the antifuse material. Other examples are readily ascertainable by one skilled in the art and may be made without departing from the spirit and scope of the invention as defined by the following claims.

What is claimed is:

1. A device for controlling current in a circuit, comprising:
    an antifuse material consisting essentially of hydrogenated microcrystalline silicon carbide ($\mu$C-SiC:H) formed between two conductors.

2. A device for controlling a current path within a circuit comprising:
    a first conduction element;
    a second conduction element; and
    an antifuse material separating said first conduction element from said second conduction element, said antifuse material consisting essentially of hydrogenated microcrystalline silicon carbide ($\mu$C-SiC:H).

3. The device of claim 2, further comprising:
    an insulating material between said first conduction element and said second conduction element.

4. The device in accordance with claim 2 further comprising a filament within said antifuse material to allow current to flow between said first and second conduction elements.

5. The device of claim 4, wherein said filament is formed by applying a high voltage pulse across said first and second conduction elements.

6. An electrically conductive path between two spaced-apart conductors comprising:
    an antifuse in contact with said two conductors, said antifuse consisting essentially of hydrogenated microcrystalline silicon carbide ($\mu$C-SiC:H),
    said antifuse having been broken down by the application of a voltage pulse between said first and second conductors.

7. The electrically conductive path in accordance with claim 6 wherein current has been forced through said antifuse to establish a permanent electrically conductive path between said conductors.

* * * * *